United States Patent
Wong et al.

(10) Patent No.: US 7,749,916 B2
(45) Date of Patent: *Jul. 6, 2010

(54) ADDITIVE PRINTED MASK PROCESS AND STRUCTURES PRODUCED THEREBY

(75) Inventors: William Wong, San Carlos, CA (US); Scott Limb, Palo Alto, CA (US); Michael Chabinyc, Burlingame, CA (US); Beverly Russo, Sunnyvale, CA (US); Rene Lujan, Sunnyvale, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 1 day.

This patent is subject to a terminal disclaimer.

(21) Appl. No.: 12/046,242

(22) Filed: Mar. 11, 2008

(65) Prior Publication Data
US 2008/0153014 A1    Jun. 26, 2008

Related U.S. Application Data

(63) Continuation of application No. 10/536,102, filed on Jan. 20, 2006, now Pat. No. 7,365,022.

(51) Int. Cl.
*H01L 21/31*  (2006.01)
(52) U.S. Cl. .............. 438/758; 430/7; 257/E21.024
(58) Field of Classification Search .......... 438/758, 438/780, 781, 942; 430/7
See application file for complete search history.

(56) References Cited

U.S. PATENT DOCUMENTS

| | | | |
|---|---|---|---|
| 3,958,252 A | 5/1976 | Kashio | |
| 4,131,899 A | 12/1978 | Christou | |
| 4,533,624 A | 8/1985 | Sheppard | |
| 4,959,674 A | 9/1990 | Khuri-Yakub et al. | |
| 5,958,122 A | 9/1999 | Fukuda et al. | |
| 6,116,718 A | 9/2000 | Peeters et al. | |
| 6,306,933 B1 | 10/2001 | Eiger et al. | |
| 6,468,702 B1 | 10/2002 | Yi et al. | |

(Continued)

FOREIGN PATENT DOCUMENTS

GB  2127751 A  4/1984

(Continued)

OTHER PUBLICATIONS

Koch et al., "Influence of water on the work function of conducting poly (3,4-ethylenedioxythiophene)/poly (styrenesulfonate)", Appl. Phys. Let. 90, 043512 (2007).

(Continued)

*Primary Examiner*—Walter L Lindsay, Jr.
*Assistant Examiner*—Reema Patel
(74) *Attorney, Agent, or Firm*—Jonathan A. Small

(57) ABSTRACT

A digital lithographic process first deposits a mask layer comprised of print patterned mask features. The print patterned mask features define gaps into which a target material may be deposited, preferably through a digital lithographic process. The target material is cured or hardened, if necessary, into target features. The mask layer is then selectively removed. The remaining target features may then be used as exposure or etch masks, physical structures such as fluid containment elements, etc. Fine feature widths, narrower the minimum width of the print patterned mask features, may be obtained while realizing the benefits of digital lithography in the manufacturing process.

20 Claims, 10 Drawing Sheets

U.S. PATENT DOCUMENTS

| | | |
|---|---|---|
| 6,742,884 B2 | 6/2004 | Wong et al. |
| 6,759,713 B2 | 7/2004 | Chabinyc et al. |
| 6,838,361 B2 | 1/2005 | Takeo |
| 6,872,320 B2 | 3/2005 | Wong et al. |
| 6,872,588 B2 | 3/2005 | Chabinyc et al. |
| 6,890,050 B2 | 5/2005 | Ready et al. |
| 6,972,261 B2 | 12/2005 | Wong et al. |
| 2002/0097356 A1 | 7/2002 | Kawase et al. |
| 2002/0164884 A1 | 11/2002 | Lishan |
| 2003/0197754 A1 | 10/2003 | Nakamura |
| 2004/0110099 A1 | 6/2004 | Kozawa et al. |
| 2004/0253835 A1 | 12/2004 | Kawase |
| 2005/0136358 A1 | 6/2005 | Paul et al. |
| 2005/0255392 A1 | 11/2005 | Tsai et al. |

FOREIGN PATENT DOCUMENTS

| | | |
|---|---|---|
| JP | 01003663 A | 1/1989 |

OTHER PUBLICATIONS

European Search Report, EP 07100905, dated Mar. 27, 2008 (7 pages).

European Search Report, EP 07100906, dated Mar. 27, 2008 (8 pages).

ADDITIVE PRINTED MASK PROCESS AND STRUCTURES PRODUCED THEREBY

CROSS-REFERENCE TO RELATED APPLICATIONS

The present invention is related to copending U.S. Application for Letters Patent titled "Process For Forming A Feature By Undercutting A Printed Mask" by Limb et al., Ser. No. 11/336,365, filed Jan. 20, 2006 and assigned to the same assignee as the present application, and further which is hereby incorporated herein by reference.

The present application is a continuation of application Ser. No. 10/536,102, filed Jan. 20, 2006, to which priority is claimed and which is incorporated by reference herein.

STATEMENT REGARDING FEDERALLY SPONSORED RESEARCH AND DEVELOPMENT

This invention was made with government support under contract number 70NANB3H3029 (Novel x-Ray) awarded by the U.S. Government National Institute of Standards and Technology—ATP. The government has certain rights in the invention.

BACKGROUND OF THE INVENTION

1. Field of the Invention

This invention relates generally to electronic device fabrication processes, and more particularly to a method of employing a printed mask to form features narrower than the printed mask feature width.

2. Description of the Prior Art

Digital lithography is a maturing technology designed to reduce the costs associated with photolithographic processes, used often in the fabrication of micro-electronic devices, integrated circuits, and related structures. Digital lithography directly deposits patterned material onto a substrate in place of the delicate and time-consuming photolithography processes used in conventional manufacturing processes. The printed pattern produced by digital lithography can either comprise actual device features (i.e., elements that will be incorporated into the final device or circuitry, such as the source, drain, and gate regions of thin film transistors, signal lines, opto-electronic device components, etc.) or it can be a mask for subsequent semiconductor processing (e.g., etch, implant, etc.) Importantly, unlike traditional lithographic systems, digital lithography systems avoid the cost and challenges associates with the use of reticles or masks.

Typically, digital lithography involves depositing a print material by moving a printhead and a substrate relative to one another along a single axis (the "print travel axis"). Print heads, and in particular, the arrangements of the ejectors incorporated in those print heads, are optimized for printing along this print travel axis. Printing takes place in a raster fashion, with the print head making "printing passes" across the substrate as the ejector(s) in the print head dispense individual "droplets" of print material onto the substrate. Typically, the print head moves relative to the substrate in each printing pass, but the equivalent result may be obtained if the substrate is caused to move relative to the print head (for example, with the substrate secured to a moving stage) in a printing pass. At the end of each printing pass, the print head (or substrate) makes a perpendicular shift relative to the print travel axis before beginning a new printing pass. Printing passes continue in this manner until the desired pattern has been fully printed onto the substrate.

Materials typically printed by digital lithographic systems include phase change material and solutions of polymers, colloidal suspensions, such suspensions of materials with desired electronic properties in a solvent or carrier. For example, U.S. Pat. Nos. 6,742,884 and 6,872,320 (each incorporated herein by reference) teach a system and process, respectively, for printing a phase change material onto a substrate for masking. According to these references, a suitable material, such as a stearyl erucamide wax, is maintained in liquid phase over an ink-jet style piezoelectric printhead, and selectively ejected on a droplet-by-droplet basis such that droplets of the wax are deposited in desired locations in a desired pattern on a layer formed over a substrate. The droplets exit the printhead in liquid form, then solidify after impacting the layer, hence the material is referred to as phase-change.

Once dispensed from an ejector, a print material droplet attaches itself to the substrate through a wetting action, then proceeds to solidify in place. In the case of printing phase-change materials, solidification occurs when a heated and liquefied printed droplet loses its thermal energy to the substrate and/or environment and reverts to a solid form. In the case of suspensions, after wetting to the substrate, the carrier most often either evaporates leaving the suspended material on the substrate surface or the carrier hardens or cures. The thermal conditions and physical properties of the print material and substrate, along with the ambient conditions and nature of the print material, determine the specific rate at which the deposited print material transforms from a liquid to a solid, and hence the height and profile of the solidified deposited material.

If two adjacent droplets are applied to the substrate within a time prior to the solidification of either or both droplets, the droplets may wet and coalesce together to form a single, continuous printed feature. Surface tension of the droplet material, temperature of the droplet at ejection, ambient temperature, and substrate temperature are key attributes for controlling the extent of droplet coalescence and lateral spreading of the coalesced material on the substrate surface. These attributes may be selected such that a desired feature size may be obtained.

However, one disadvantage of digital lithography is that due to the relatively large minimum drop size, currently on the order of 20-40 µm (micrometers) in diameter, device features manufactured by this process tend to be relatively large. For example, each pixel of a modern color flat-panel display comprises a color filter located above or below a group of thin film transistors. Each pixel comprises three sub-pixels, one for each color red, green, and blue, separated by a grid or frame. The frame is typically first formed, then filled with colored material to form the sub-pixels. Current color pixels are in the neighborhood of 100 µm wide. Each sub-pixel is on the order of 25-30 µm wide, and the width of each section of the frame is on the order of 10 µm. A digital lithographic process which produces drops no smaller than 20 µm wide is thus incapable of directly providing a droplet mask to form the sub-pixel frame. Thus, while it is known that available printing systems are capable of very accurate drop placement, the relatively large drop size has heretofore limited the scope of application of digital lithographic systems.

SUMMARY OF THE INVENTION

Accordingly, the present invention provides a method for manufacturing micro-electronic, opto-electronic, bio-electronic, or similar devices employing digital lithography, the devices having smaller feature sizes than heretofore possible with digital lithography.

The process according to the present invention preferably uses a digital lithography system which deposits a phase change material. The phase change material is deposited in a pattern to form an indirect mask. Subsequent steps of the process deposit or remove additional material to obtain the target features.

According to one aspect of the invention, a mask pattern is formed by digital lithography on the surface of a substrate. The mask pattern is formed to include gaps which are equal in width to the desired width of the final feature to be formed (the target feature). This is possible, since digital lithography systems are capable of controllably depositing droplets with an inter-droplet spacing less than a droplet diameter. A target material is deposited over (or between) the mask, by digital lithography, capillary action or other appropriate method. While the mask material is well controlled in terms of dispersion, wetting, etc., the target material is less well controlled. The target material fills the gaps formed in the mask. The mask acts as a form for the target material, overcoming issues associated with controlling the deposition of the target material. The target material may then be cured or hardened, if necessary, and the mask removed, producing the target feature.

According to a variation of this aspect of the present invention, the target material is a black matrix material (e.g., a pigmented polymer). The target features are a sub-pixel frame for a color display device. The gaps in the mask material are on the order of 10 μm wide, and the resulting width of the segments of the sub-pixel frame are accordingly on the order of 10 μm wide, narrower than the diameter of the individual droplets forming the mask.

According to another aspect of the present invention, the target feature is formed of layers of target material, each layer having a desired property. For example, a multi-layered target feature may be comprised of layers of hydrophilic material below layers of hydrophobic material. Such a target structure is useful in preventing the wetting of material abutting against the target structure, for example the spreading of a first fluid from one lateral side of the structure over its top and onto the opposite lateral side of the structure.

The above is a summary of a number of the unique aspects, features, and advantages of the present invention. However, this summary is not exhaustive. Thus, these and other aspects, features, and advantages of the present invention will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION OF THE INVENTION

Figure 1A:
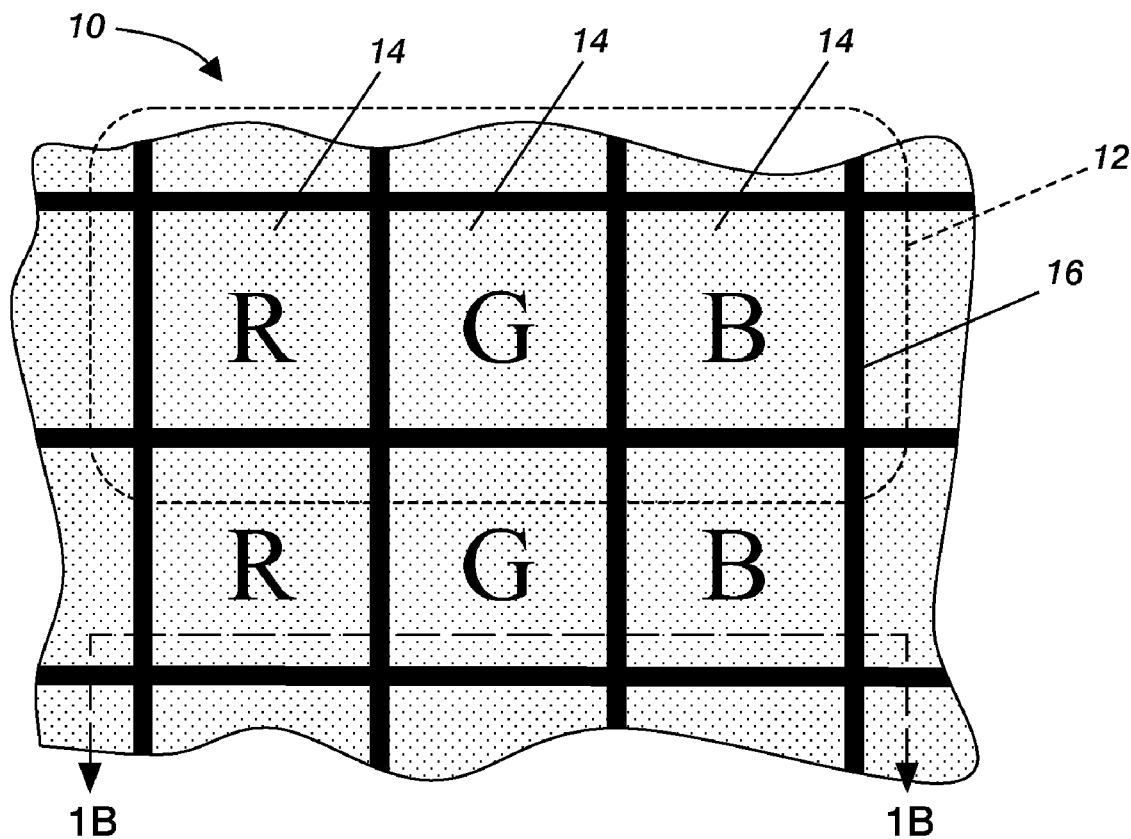
FIG. 1A is a plan view of a color filter for a flat panel display according to the prior art.
Figure 1B:
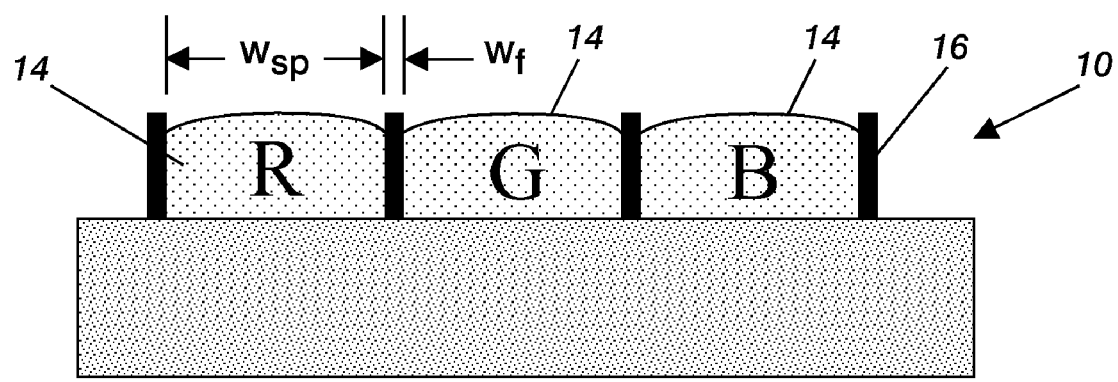
FIG. 1B is a profile view of the color filter for FIG. 1A.

With reference initially to FIGS. 1A and 1B, there is shown therein a structure of the type formed by one embodiment of the present invention. FIGS. 1A and 1B are illustrations of a portion of a color filter 10 for a plat-panel display. As mentioned, such a filter comprises a number of pixels 12, each pixel being composed of three or more sub-pixels 14. The actual geometry of the sub-pixels, such as triangular, striped, diagonal, etc. is not critical to the operation of the present invention, but will be discussed in further detail below. Sub-pixels 14 are each primarily transparent to a specific color of light, such as red, green or blue. The individual sub-pixels 14 are separated by a pixel frame 16. Pixel frame 16 is composed of a number of horizontal and vertical elements which form cavities, shown in FIG. 1B, for the receipt of material forming sub-pixels 14. For reference, it will be assumed that the width $w_{sp}$ of each sub-pixel is on the order of 25 to 30 μm and the width $w_f$ of each pixel frame element is on the order of 10 μm.

In order to form the structure illustrated in FIGS. 1A and 1B, specific steps according to the present invention are described. FIGS. 2A through 2H illustrate the structure at several intermediate stages of its production according to a process illustrated in FIG. 3. While the following description makes specific reference to the structure illustrated in FIGS. 2A through 2H, without making more specific reference thereto the description is following the sequence illustrated in FIG. 3.

Figure 2A:
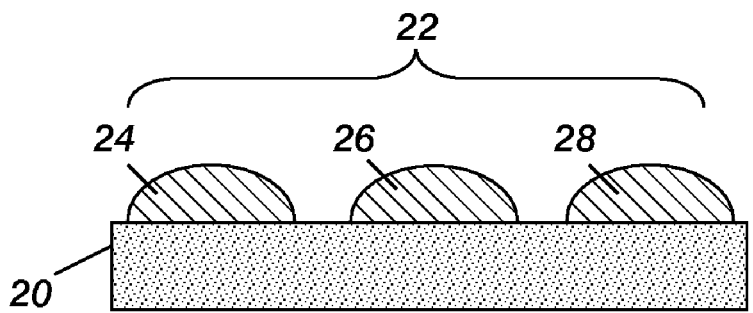
FIG. 2A is a cross sectional view of a structure at a first stage in the process of forming a sub-pixel frame according to one embodiment of the present invention.
Figure 3:
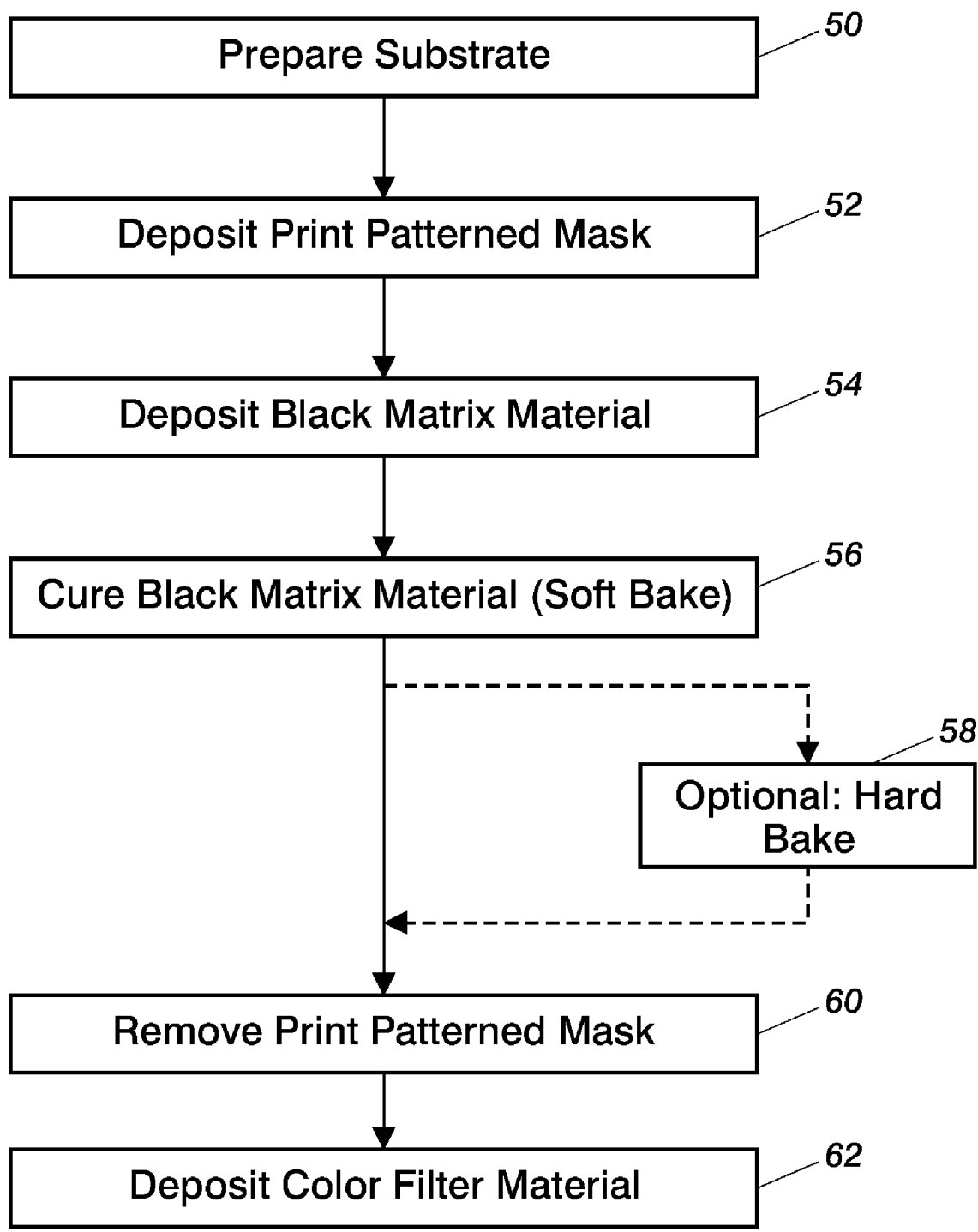
FIG. 3 is a process flow diagram illustrating the steps involved in the formation of a sub-pixel frame according to one embodiment of the present invention.

With reference initially to FIG. 2A, the process begins with a suitable substrate 20, such as glass or plastic, such as poly ethylene napthalate. onto which mask 22 is formed. Mask 22 is preferably formed by a digital lithographic process (and hence referred to as a "print patterned mask"), and comprises individual or coalesced droplets of a phase change material such as stearyl erucamide wax (for example, Kemamide 180-based wax from Crompton Corporation of Middlebury, Conn.), or similar material which is well controlled in terms of print quality (i.e., droplet size and shape, solidification time, hardness of solidified structure, etc.) Examples of systems appropriate for the ejection of droplets of phase change material include: ink-jet systems (such as disclosed in U.S. Pat. No. 4,131,899, which is incorporated herein by reference), ballistic aerosol marking (BAM) devices (such as disclosed in U.S. Pat. No. 6,116,718, which is incorporated herein by reference), acoustic ink printer (AIP) systems (U.S. Pat. No. 4,959,674, which is incorporated herein by reference), carrier-jet ejectors (as disclosed in U.S. Pat. No. 5,958,122, which is incorporated by reference herein), deflection-controlled ink-jet systems (such as disclosed in U.S. Pat. No. 3,958,252, which is incorporated herein by reference), etc. Such systems also include pattern transfer systems, such as: xerographic, ionographic, screen, contact, and gravure printing systems, etc.

While the embodiment discussed herein involves the formation of a print patterned mask directly on substrate 20, it is within the spirit and scope of the present invention that such a mask, and the features formed thereby, be formed over other layers, such as layers containing previously formed devices. Accordingly, it may be necessary to positionally register the formation of mask 22. Registration is routinely accomplished in digital lithographic systems by use of fiduciary marks, digital imaging and processing, and processor controlled relative motion of the ejector and the substrate. The ability to align the mask layer through image processing prior to patterning is a significant advantage of the digital-lithographic process over other patterning methods.

Figure 2B:
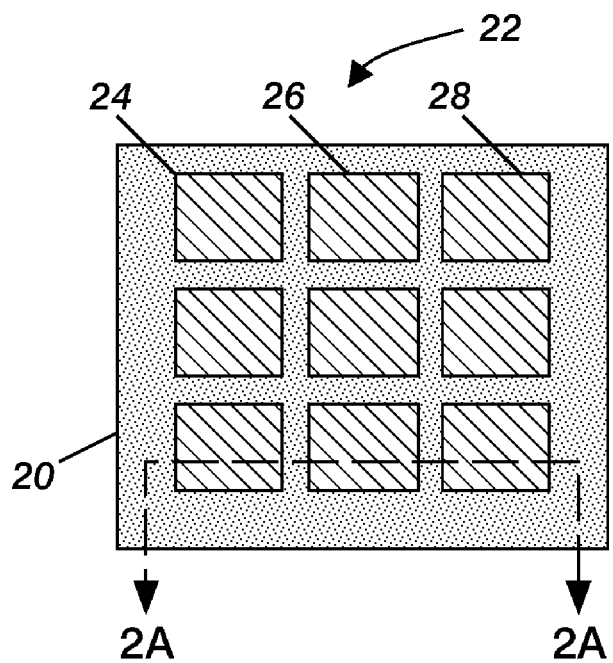
FIG. 2B is a plan view of the structure shown in FIG. 2A.

For illustrative purposes, FIG. 2A shows three individual, adjacent but not contiguous digital lithographic masking elements (i.e., droplets) 24, 26, 28. A plan view of this arrangement is illustrated in FIG. 2B. For the purposes of illustration, droplets 24, 26, 28 will be assumed to be on the order of 25-30 µm in diameter, corresponding to the width of a sub-pixel of a color flat-screen display. However, the width of the individual print patterned mask features may be an arbitrary size greater than or equal to the minimum diameter of a droplet ejected by the digital lithography system used, depending on the feature and device to be formed. For example, to achieve a width greater than the diameter of a single droplet, adjacent droplets may be deposited such that they coalesce into a single feature as they solidify. Furthermore, the edge-to-edge spacing between droplets is assumed for the purposes of illustration to be on the order of 10 µm, corresponding to the width of an element of a sub-pixel frame. However, according to the present invention, the spacing between individual print patterned mask features may be an arbitrary size, limited only by the resolution of the printhead or stage employed by the digital lithography system, and a function of the feature and device to be formed.

In select instances, adhesion promoters of the type commonly used with photoresist materials in the semiconductor processing art provide improved adhesion of the phase change material. For example, hexamethyldisilizane (HMDS) is used for chemically drying the substrate to promote adhesion. Other methods are annealing and plasma cleaning followed by an HMDS coating in order to clean and prepare the surface for photoresist adhesion.

Considering that the elements of the sub-pixel frame (FIGS. 1A, 1B) are assumed to be on the order of 10 µm wide, and the digital lithographic masking elements (i.e., the individual droplets) are typically much wider (e.g., on the order of 25-30 µm), the digital lithographic masking elements do not make feasible feature masks. Accordingly, the masking elements are not used to directly mask such features, but are instead used as indirect masks.

Figure 2C:
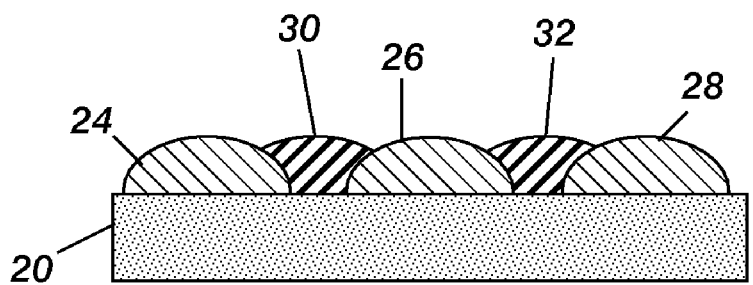
FIG. 2C is a cross sectional view of a structure at a second stage in the process of forming a sub-pixel frame according to one embodiment of the present invention.
Figure 2D:
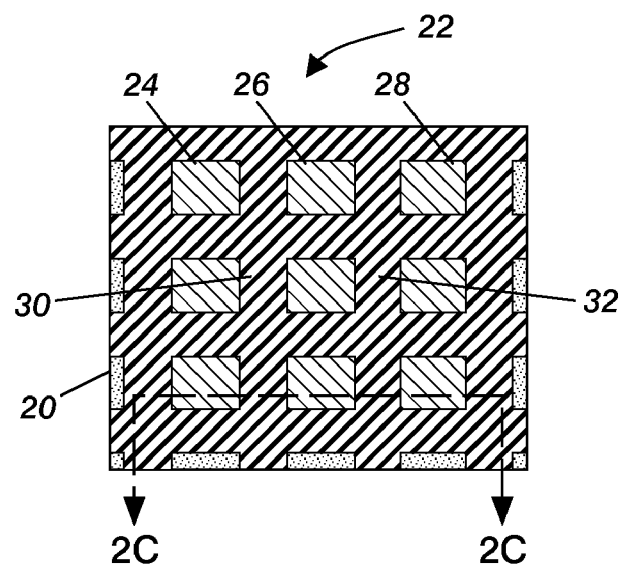
FIG. 2D is a plan view of the structure shown in FIG. 2C.

According to this embodiment, a black matrix material is deposited over selected portions of mask 22, filling the interstices between the digital lithographic masking elements 24, 26, 28, and forming black matrix regions 30, 32, as illustrated in FIG. 2C. A plan view of the structure at this point in the process is illustrated in FIG. 2D. The black matrix material is typically a curable polymer with suspended dark pigment such as a polyimide dissolved or suspended in an organic solvent. The black matrix material can either be thermally curable or photocurable. For thermally curable materials, it is possible to partially cure the material to improve its resistance to attack by solvents at a temperature, for example 100 C, significantly lower than its final curing temperature, for example 150 to 200 C. Certain materials are less well controlled in terms of print quality than others. For example, if deposited directly on a substrate, uncured black matrix material tends to wet and spread across the substrate surface, in flattened, wide, and uncontrolled geometries. Accordingly, mask 22, and more precisely the digital lithographic masking elements 24, 26, 28, serve to constrain the dispersal of the black matrix material until it is cured, much like a form.

The black matrix material can be deposited using a number of techniques. If the mask material completely covers each pixel opening then the black matrix material can be coated onto the substrate by dip coating or by blade, or slit, coating. An alternative method is to fill the interstices by capillary filling as the masking elements may in certain embodiments form a set of open fluidic channels on the substrate. In this case, an appropriate volume of the liquid black matrix material can be deposited onto a small portion or portions of the substrate and maintained in liquid form in order to allow it to flow into the open channels across a larger portion of the substrate. This method can minimize printing of the black matrix, since the capillary or wicking forces provide an even distribution of the black matrix fluid over the array.

According to one embodiment, the black matrix material is then cured by raising its temperature. To accomplish this, the structure may be placed in an oven at a desired temperature for a selected length of time. The temperature needed to cure the black matrix material must be lower than the melting temperature of the phase change material forming the digital lithographic masking elements 24, 26, 28, since the mask 22 must remain in place until the black matrix material is fully cured. Accordingly, the melting temperature of the phase change material must not be so high as to make it's ejection from the digital photolithographic system problematic, nor so low as to interfere with the curing of the black matrix material. An example of the conditions for an appropriate bake of the black matrix material are 50° C. to 60° C. for 15 to 20 minutes (but will ultimately depend on the actual selection of the black matrix material).

According to an alternate embodiment, the black matrix material may be another phase-change material that has a higher melting point than the mask material and can be selectively removed. For example, Corsair Wax (Xerox Corporation, Stamford, Conn.) has a high melting temperature and does not dissolve as readily in solvent as the aforementioned Kemamide wax. Thus, when tinted, the Corsair Wax may serve as a black matrix material. Furthermore, hardenable colloidal solutions (i.e., those that harden as the carrier solvent evaporates and leave behind the solid material such as nano-particles) can be processed as a liquid and dry as a solid. Thus, an appropriate colloidal solution bearing tinted solids may be deposited to form the black matrix. In each case, however, curing is replaced with a corresponding process (i.e., cooling, evaporation) for producing a hardened black matrix.

According to a still further alternate embodiment, the black matrix material is a thermally curable polymer with suspended dark pigment. The processing of the black matrix material in this case involves careful control of the degree of curing, or cross-linking, in the black matrix film. After deposition of the black matrix material, the film is partially cured to a point to permit patterning by development in standard TMAH baths. These types of black matrix materials are commercially available, such as DARC 400 from Brewer Science (Danvers, Mass.).

Once the black matrix material is hardened, and self-supporting black matrix regions 30, 32 are formed, the mask 22 may be removed. One of a variety of solvents may be used for this purpose, such as SVC-28 (MicroChem Corporation, Newton, Mass.). SVC-28 is a debonding solution manufactured by Rohm-Hass. The active ingredients are dipropylene glycol monomethyl ether, citrus distallate, synthetic isoparraffinic hydrocarbon, and aliphatic hydrocarbon. Where the black matrix material is a polyimide-based material that is dissolved or suspended in organic solvents similar to positive photoresist material, a negative photoresist stripper may selectively remove the masking elements while leaving the cured black matrix material unaffected. (Thus, the solvent used will depend upon the actual selection of the materials forming the digital lithographic masking elements and the black matrix regions.) The solvent selectively removes the masking material but not the cured black matrix material nor the substrate (or any devices or layers on which the aforementioned structure is formed). This is illustrated in cross-section in FIG. 2E and in plan view in FIG. 2F.

In certain circumstances, it may be desirable to form attack points for the removal of the digital lithographic masking elements. These are points where the solvent is provided greater access to the surface of the masking elements. Once the black matrix material is cured by the relatively low temperature bake (referred to as a "soft bake"), the structure may be subjected to a second, higher temperature bake, on the order of 120° C. to 150° C. for 5 to 15 minutes (referred to as a "hard bake"). The hard bake causes a partial melting of the masking elements, and a consequent disconnection of the masking material from the surface of the cured black matrix material. The gap thus formed between the black matrix material and the masking material allows the solvent better access to the masking material, and hence a more thorough and complete removal of that material from the structure. However, the hard bake is an optional step in the process.

After removal of the mask, some formulations of the black matrix will need a further curing step to fully harden the material. Typical temperatures for such steps are 150 C or higher.

At this point the structure comprises robust black matrix structures 30, 32 which may serve numerous purposes. First, such structures may serve as exposure or etch masks for layers formed thereunder (not shown). While described above as being formed of a black matrix material, structures 30, 32 may alternatively be formed of other materials which exhibit selected properties, such as electrical, thermal or optical conductance or insulation, or a desired degree of rigidity or flexibility. Accordingly, a wide variety of structures may thus be produced, where the structures 30, 32 may be electrical contacts, conductors, channels, thermal or optical filters, micromechanical actuators, etc. However, in keeping with the aforementioned description, and without limiting the scope of the present invention, it will be assumed below that black matrix structures 30, 32 serve as elements of a sub-pixel frame.

Figure 2E:
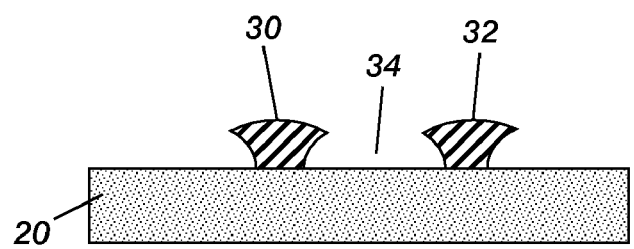
FIG. 2E is a cross sectional view of a structure at a third stage in the process of forming a sub-pixel frame according to one embodiment of the present invention.
Figure 2F:
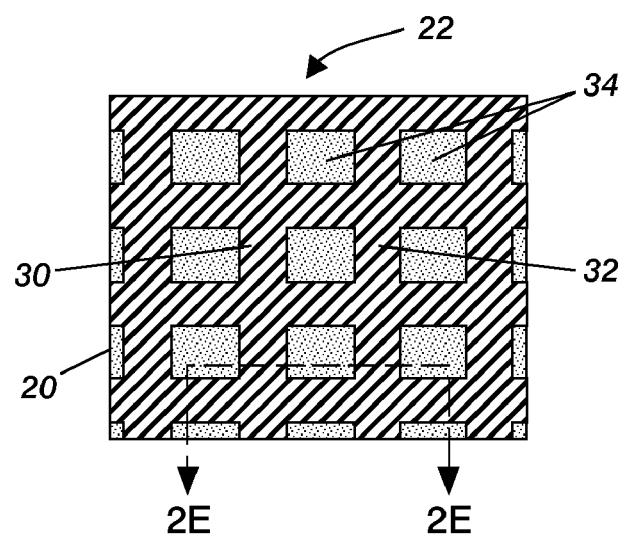
FIG. 2F is a plan view of the structure shown in FIG. 2E.
Figure 2G:
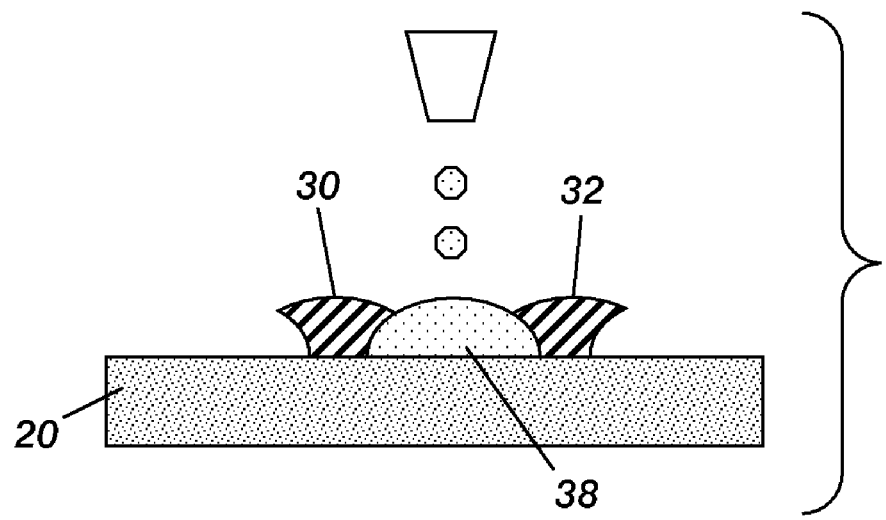
FIG. 2G is a cross sectional view of a structure at a fourth stage in the process of forming a sub-pixel frame according to one embodiment of the present invention.
Figure 2H:
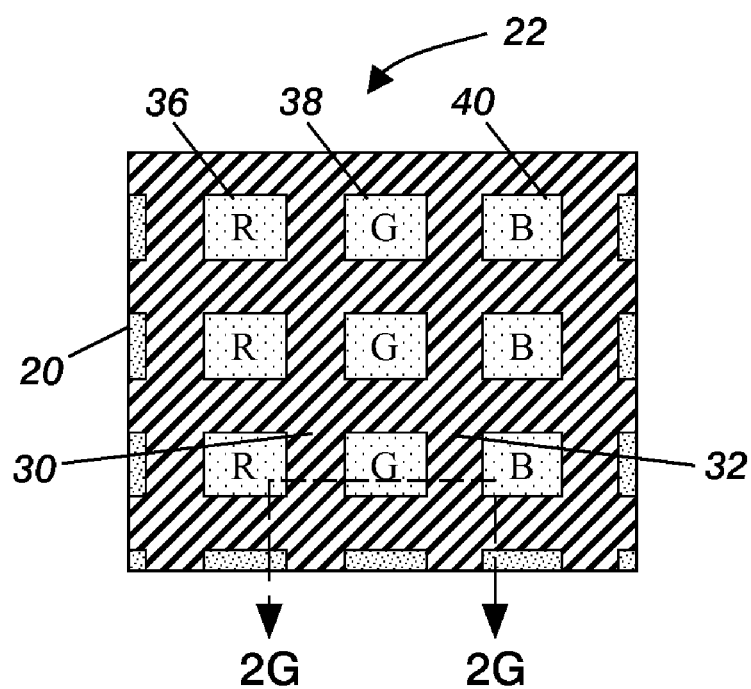
FIG. 2H is a plan view of the structure shown in FIG. 2G.

The removal of the masking material results in the formation of wells 34 in the regions between the self-supporting black matrix material regions 30, 32, as shown in FIG. 2E. Wells 34 are bounded on all sides by the black matrix material, as illustrated in FIG. 2F. Thus, wells 34 form convenient receptacles for color filter material. The color filter material may comprise a pigmented polymer, for example. The pigment may selectively permit the transmission of red, green or blue light. The appropriate color filter material may thus be deposited, for example by a digital lithographic system, into selected wells to form sub-pixels for the color filter, as shown in FIG. 2G. For example, an ink jet printing system may be employed to first fill every first, fourth, seventh, etc., well with a red tinted filter material. That same system may then be employed to deposit a green tinted filter material in every second, fifth, eighth, etc., well. And likewise, a blue tinted color filter material may be deposited in a third pass over the structure into every third, sixth, ninth, etc., well. The color filter material is typically thermally cured to harden the film. The color filter with filled wells 36, 38, 40 shown in FIG. 2H is thus obtained.

In the deposition of the color filter materials, care must be taken to prevent cross-contamination of the various individual color filter materials. For example, any introduction of the green color filter material into the well containing the red color filter material will result in poor color separation of the final display. Such cross contamination can occur due to inaccuracies in the filling of the wells, from physical disruption of the color filter structure, from inadequate sub-pixel frame structure, and from wetting of the color filter material causing it to spread out of its designated well and into surrounding wells. One advantage of the present invention is that the cross sections of the sub-pixel frame elements (the black matrix features) will tend to be concave or curve inward toward the top of the well. This stands in sharp contrast to prior art structures, which typically have a profile tapering outward toward the top of the well, which in fact promotes wetting of the color filter material into neighboring wells. It will be appreciated that the degree of curvature or concavity of the sub-pixel frame elements may be controlled by controlling the degree of spreading of the print patterned masking elements.

Furthermore, according to another embodiment of the preset invention, the black matrix material may be "engineered" to have desired hydrophobic or hydrophilic properties along its elevation to assist in preventing such wetting-induced cross-contamination. The black matrix material may be formed as a multiple layered structure with lower layers more hydrophilic and upper layers more hydrophobic. The black matrix material may be deposited in layers, with intermediate curing or hardening to avoid intermixture of the layers, or may be deposited as a single compound, then treated, for example by thermal annealing, to separate the materials into distinct layers. Such a structure advantageously reduces the tendency of the color filter material to wet across sub-pixel frame boundaries.

Figure 4A:
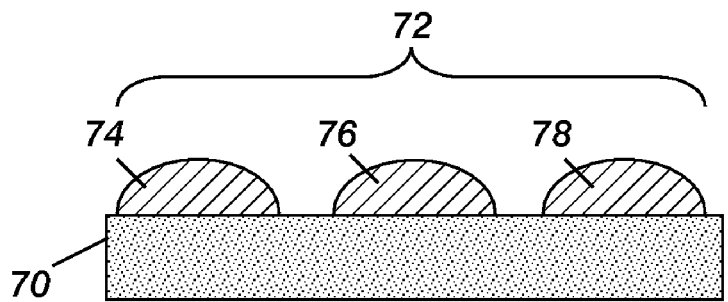
FIG. 4A is a cross sectional view of a structure at a first stage in the process of forming a sub-pixel frame according to a second embodiment of the present invention.
Figure 4B:
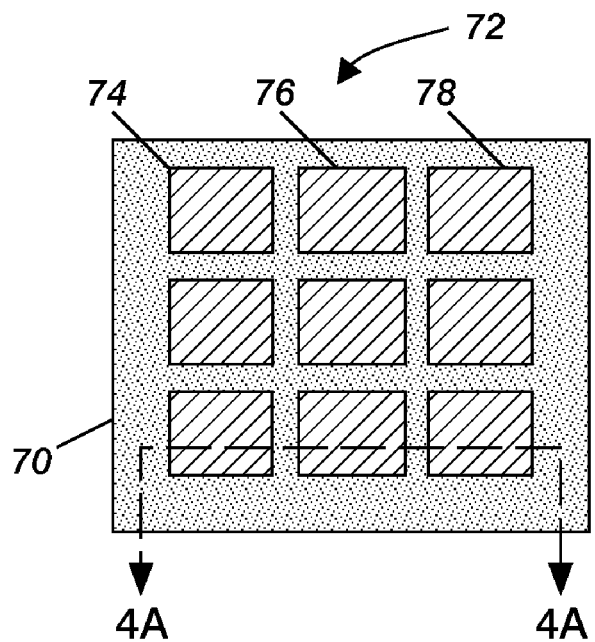
FIG. 4B is a plan view of the structure shown in FIG. 4A.

A structure produced by a process according to this aspect of the present invention is shown in FIGS. 4A through 4J. FIG. 5 illustrates the process flow according to this embodiments. Initially, the structure is quite similar to that described above with regard to FIGS. 2A and 2B. With reference to FIG. 4A, a suitable substrate 70 is selected, such as glass, silicon, fused silica, quartz, MgO, sapphire, glass or plastic, such as poly ethylene napthalate. In the case in which a color filter panel is to be produced, the substrate will typically be a transparent material, such as glass or plastic. Print patterned mask 72 is formed on substrate 70. Print patterned mask 72 is preferably formed by a digital lithographic process, and comprises a number of spaced-apart mask features 74, 76, 78. Adhesion promoters may be employed and alignment may be accomplished as previously discussed. FIG. 4B is a plan view of the structure at this point in its fabrication.

Figure 4C:
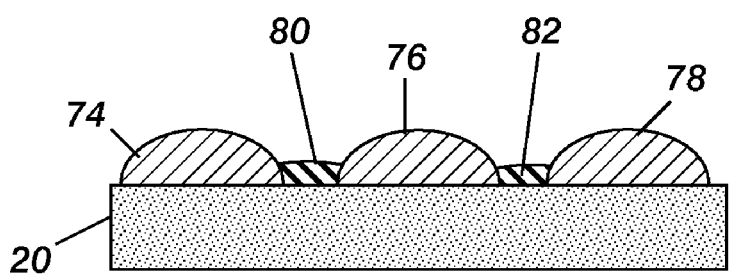
FIG. 4C is a cross sectional view of a structure at a second stage in the process of forming a sub-pixel frame according to the second embodiment of the present invention.
Figure 4D:
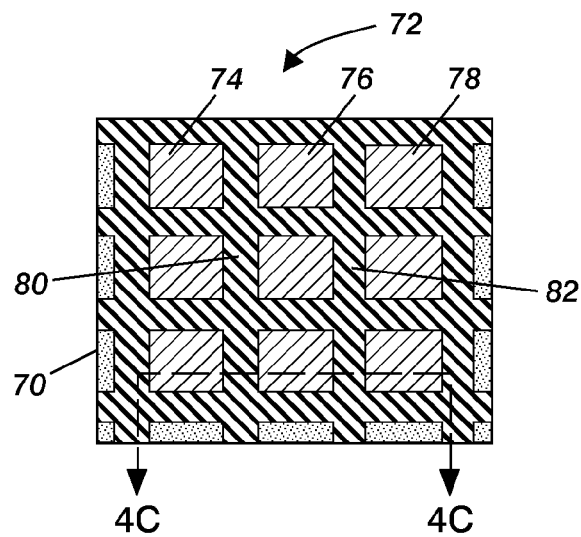
FIG. 4D is a plan view of the structure shown in FIG. 4C.
Figure 5:
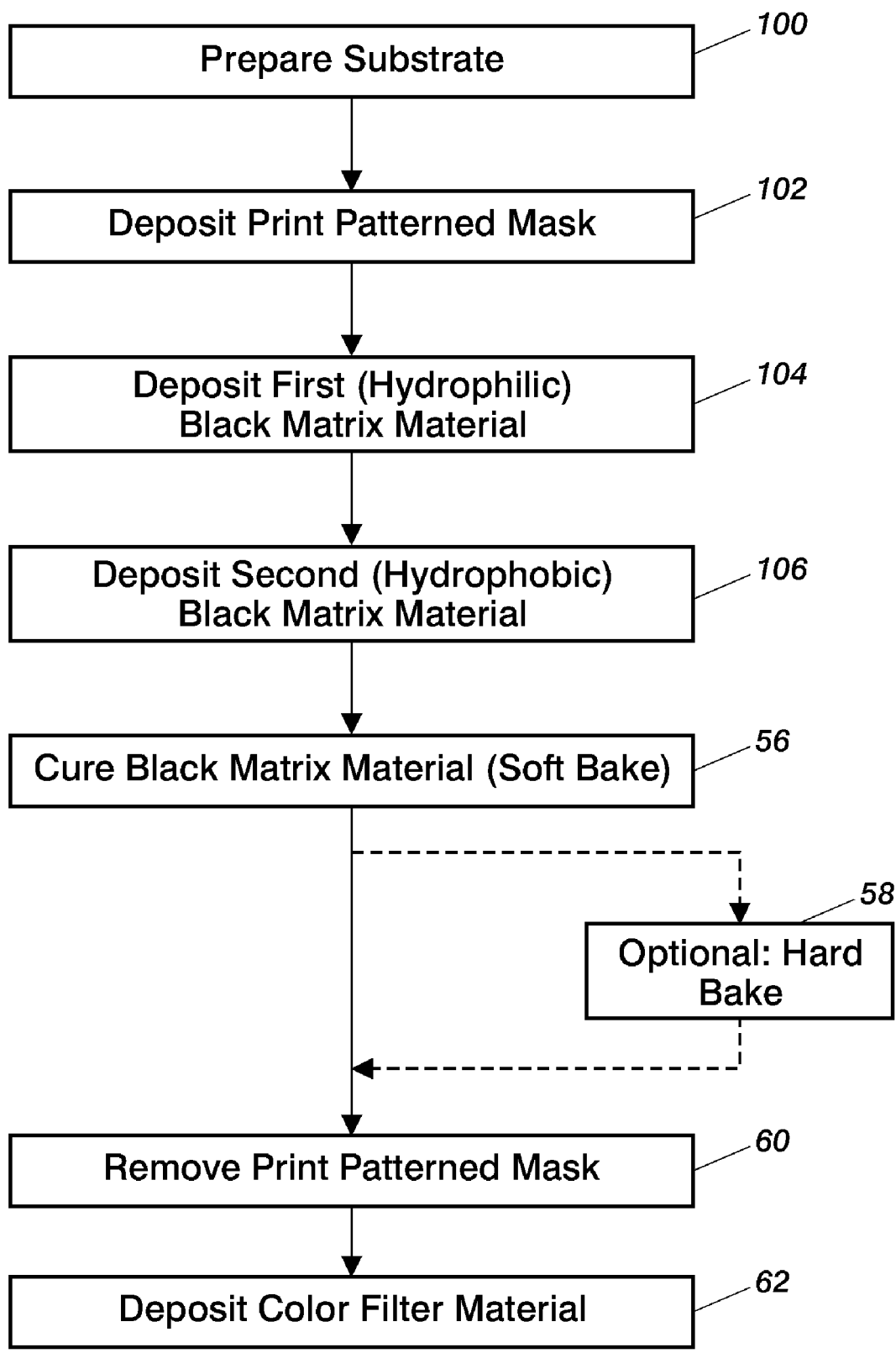
FIG. 5 is a process flow diagram illustrating the steps involved in the formation of a sub-pixel frame according to one embodiment of the present invention.

With reference now to FIG. 4C, a first black matrix material is deposited over selected portions of mask 72, partially filling the interstices between the masking elements 74, 76, 78, and forming first black matrix regions 80, 82. The first black matrix material is selected to be hydrophilic, or relatively wettable by the solvent of the color filter material, with the aim that the first black matrix material acts to retain the color filter material within its wells. The structure at this point is baked at a temperature sufficient to cure the first black matrix material but below the melting point of the masking elements 74, 76, 78, the so-called soft bake. A plan view of the structure at this point is illustrated in FIG. 4D.

Figure 4E:
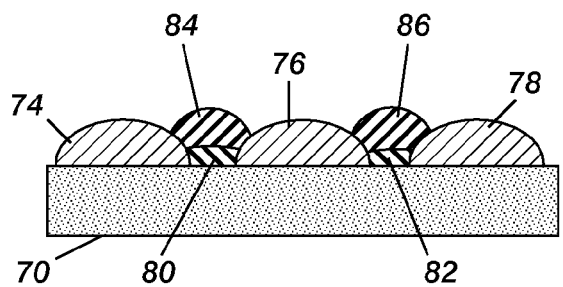
FIG. 4E is a cross sectional view of a structure at a third stage in the process of forming a sub-pixel frame according to the second embodiment of the present invention.
Figure 4F:
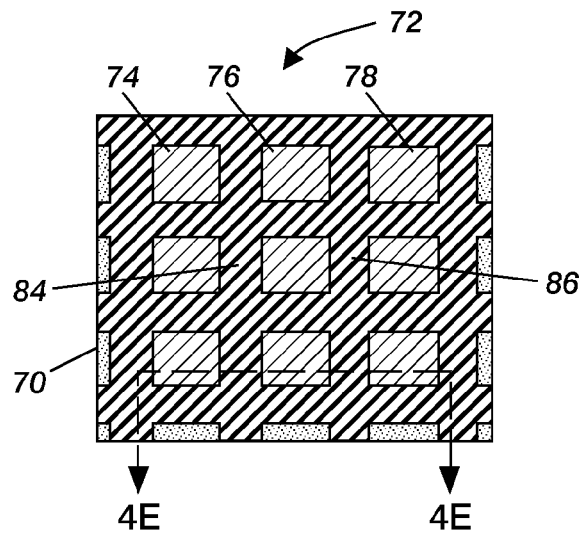
FIG. 4F is a plan view of the structure shown in FIG. 4E.

With reference now to FIG. 4E, a second black matrix material is deposited over first black matrix regions 80, 82, further partially filling the interstices between the masking elements 74, 76, 78, and forming second black matrix regions 84, 86. (The second black matrix material does not necessarily need to be "black" or even opaque. It may be a material that is solution processable that is hydrophobic or makes the surface of the first material hydrophobic.) The second black matrix material is selected to be hydrophobic with the aim that the second black matrix material acts to prevent wetting of the color filter material over the sub-pixel frame elements. The structure at this point is again soft baked to cure the second black matrix material. A plan view of the structure at this point is illustrate in FIG. 4F.

In the case of using a bilayer structure to form the structure for the black matrix, one of the layer could have a different transparency than the other. This structure is useful for cases where it may be difficult to achieve the appropriate difference in wettability if both layers are pigmented to the same extent. For example, the hydrophobic upper layer could be transparent if the optical density of the lower hydrophilic layer is high enough.

At this point, mask 72 may be removed, with or without the optional hard bake to create supplemental attack points. The solvent used for removing mask 72 will depend upon the actual selection of the material forming the digital lithographic masking elements, but may include the aforementioned tetrahydrofuran or heated SVC-28. (In the case that mask 72 is a wax, at a temperature above the melting point of the wax, SVC-28 will remove the wax from the surface even though SVC-28 is a surfactant in which the wax does not readily dissolve.) The solvent selectively removes the masking material but not the first or second cured black matrix materials nor the substrate (or any devices or layers on which the aforementioned structure is formed). This is illustrated in cross-section in FIG. 4G and in plan view in FIG. 4H.

Figure 4G:
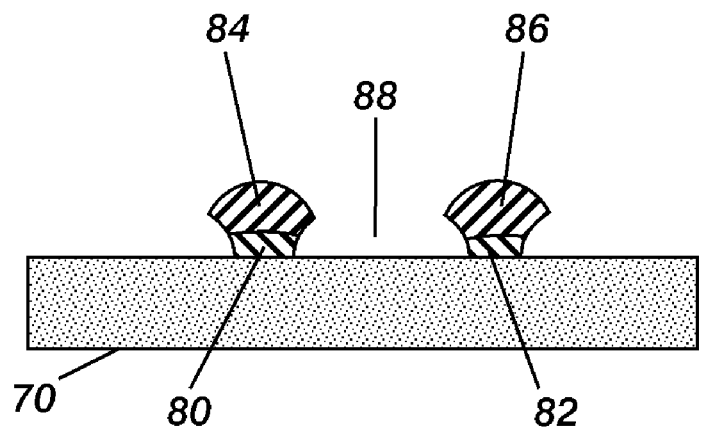
FIG. 4G is a cross sectional view of a structure at a fourth stage in the process of forming a sub-pixel frame according to the second embodiment of the present invention.
Figure 4H:
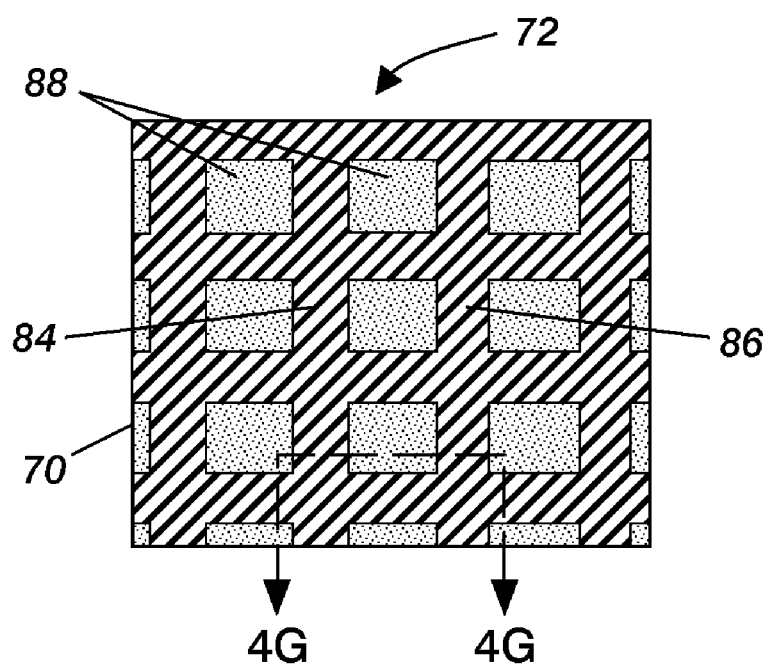
FIG. 4H is a plan view of the structure shown in FIG. 4G.
Figure 4I:
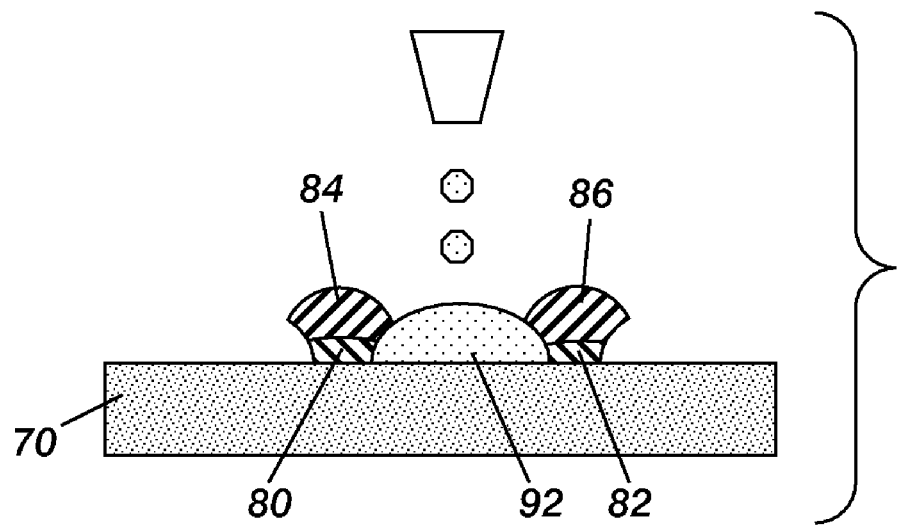
FIG. 4I is a cross sectional view of a structure at a fifth stage in the process of forming a sub-pixel frame according to the second embodiment of the present invention.
Figure 4J:
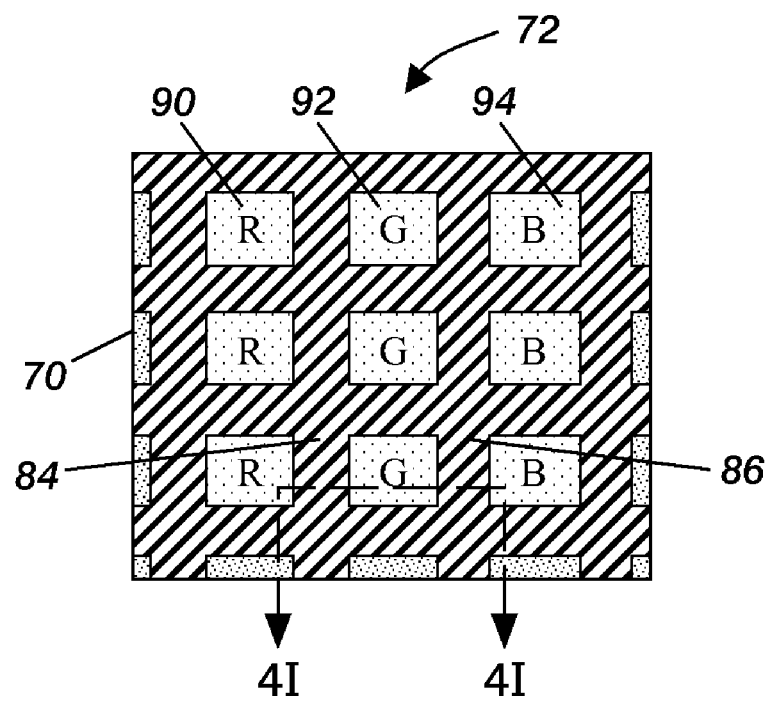
FIG. 4J is a plan view of the structure shown in FIG. 4I.

Although the material forming the lower and upper portions of the remaining black matrix structures are different, the conditions for the curing of the layers allows the layers to structurally bond, forming structurally robust, free-standing bi-layer black matrix material structures 80/84, 82/86 in which the lower regions are hydrophilic and the upper regions are hydrophobic. These structures define wells 88, as shown in FIG. 4G. Wells 88 are then filled with color filter material, as previously discussed and shown in FIG. 4I. The color filter with filled wells 90, 92, 94 shown in FIG. 4J is thus obtained.

Generally, multilayered structures 80/84, 82/86 may by engineered for a variety of desirable attributes, and capability not readily available from processes known in the art. For example, in the case where such structures serve as micromechanical actuators, they may be provided with a more flexible material at their base and a less flexible material at their tips. In the case where such structures are bioelectrical devices, they may be provided with greater reactivity to a material at the base thereof and a lesser reactivity to a material at the tip thereof, and so on.

While a plurality of preferred exemplary embodiments have been presented in the foregoing detailed description, it should be understood that a vast number of variations exist, and these preferred exemplary embodiments are merely representative examples, and are not intended to limit the scope, applicability or configuration of the invention in any way. For example, while the process of the present invention has been described to form a sub-pixel frame, the process may be used to form a wide variety of other structures, such as exposure or etch masks, contacts or elements of microelectronic, optoelectronic, bioelectronic, etc., devices, and other physical structures. Furthermore, while references to matrix material herein have been to a "black" matrix material, the actual color of the material is not critical, and the degree of opacity of the material in its final state is a function of the design targets of the device being fabricated. Accordingly, the foregoing detailed description provides those of ordinary skill in the art with a convenient guide for implementation of the invention, and contemplates that various changes in the functions and arrangements of the described embodiments may be made without departing from the spirit and scope of the invention defined by the claims thereto.

What is claimed is:

1. A method of forming a sub-pixel frame for a display device over a substrate, comprising the steps of:
   depositing a phase change material over the substrate;
      the phase change material deposited as droplets using a printing system comprising a printhead, such that a plurality of said droplets are deposited so as to coalesce;
      the printhead including at least one ejector for ejecting the phase change material in liquid phase;
      the phase change material deposited in a first printed pattern such that the first printed pattern of phase change material remains following a change from liquid phase to solid phase of the phase change material;
      the first printed pattern defining gaps;
   depositing a target material at least partially into the gaps to form target material features;
   hardening the target material features to form a sub-pixel frame; and
   removing the phase change material, leaving the sub-pixel frame on the substrate, the sub-pixel frame defining at least one well for receiving material deposited therein.

2. The method of claim 1, wherein the target material is deposited using a printing system comprising a printhead which includes at least one ejector for ejecting the target material in liquid phase, and the target material is deposited so as to form a second pattern such that the target material is primarily introduced into and fills the gaps defined by the first printed pattern.

3. The method of claim 1, wherein the step of hardening the target material comprises hardening by heating the target material.

4. The method of claim 3 wherein the temperature to which the target material is heated is below the melting temperature of the phase change material.

5. The method of claim 4, wherein following the step of hardening the target material, the target material and phase change material are heated to a temperature exceeding the melting temperature of the phase change material.

6. The method of claim 1, wherein the step of removing the phase change material comprises a single step of applying a solvent which removes the phase change material but does not affect the target material.

7. The method of claim 1, further comprising the step of depositing a supplementary target material over the target material prior to the step of removing the phase change material.

8. The method of claim 7, further comprising the step of hardening the supplementary target material to form a supplementary portion of the sub-pixel frame prior to removal of the phase change material.

9. The method of claim 8, wherein the step of hardening the supplementary target material is accomplished by heating the supplementary target material.

10. The method of claim 9 wherein the temperature to which the supplementary target material is heated is below the melting temperature of the phase change material.

11. The method of claim 1, wherein the sub-pixel frame is enclosed on all lateral sides, and the substrate forms a base of the sub-pixel frame, such that the sub-pixel frame may be substantially filled and contain a material deposited therein.

12. The method of claim 11, further comprising the step of depositing a material into the sub-pixel frame.

13. The method of claim 12, wherein the material is a hardenable pigmented liquid.

14. The method of claim 1, wherein the target material features are formed to have a generally concave cross section.

15. The method of claim 1, wherein adjacent sub-pixel frames are formed to have cross sections which curve inward toward each other, the distance between the adjacent sub-pixel frames decreasing as the distance away from the substrate increases.

16. A method of forming a sub-pixel frame for a color filter, comprising the steps of:
   depositing a phase change material over a substrate;
      the phase change material deposited as droplets using a printing system comprising a printhead, such that a plurality of said droplets are deposited so as to coalesce;
      the printhead including at least one ejector for ejecting the phase change material in liquid phase;
      the phase change material deposited in a first printed pattern such that the first printed pattern of phase change material remains following a change from liquid phase to solid phase of the phase change material;
      the first printed pattern defining gaps;
   depositing a black matrix material;
      the black matrix material deposited using a printing system comprising a printhead;
      the printhead including at least one ejector for ejecting the black matrix material in liquid phase;
      the black matrix material deposited in a second printed pattern such that the black matrix material is selectively introduced into the gaps defined by the first printed pattern;
   heating the black matrix material such that the black matrix material hardens to form a sub-pixel frame, wherein the temperature to which the black matrix material is heated is below the melting temperature of the phase change material;
   heating the black matrix material and phase change material to a temperature exceeding the melting temperature of the phase change material;
   removing the phase change material, leaving the sub-pixel frame on the substrate; and
   depositing a hardenable pigmented fluid, using a printing system comprising a printhead which includes at least one ejector for ejecting the hardenable pigmented fluid in liquid phase, in a third pattern, such that the hardenable pigmented fluid is deposited into interstitial regions in the sub-pixel frame.

17. The method of claim 16, wherein the black matrix material is hydrophilic, and further comprising the step of depositing a supplementary black matrix material over the sub-pixel frame prior to the step of removing the phase change material, the supplementary black matrix material being hydrophobic.

18. The method of claim 16, wherein the black matrix material features are formed to have a generally concave cross section.

19. The method of claim 16, wherein adjacent black matrix material features are formed to have cross sections which curve inward toward each other, the distance between the adjacent black matrix material features decreasing as the distance away from the substrate increases.

20. The method of claim 16, wherein the step of depositing a black matrix material comprises the step of depositing first and second materials, the first material being relatively more hydrophilic than the second material.

* * * * *